US012238905B2

(12) United States Patent
Kosteva et al.

(10) Patent No.: US 12,238,905 B2
(45) Date of Patent: Feb. 25, 2025

(54) COOLING SYSTEMS AND METHODS FOR COOLING CONTACTORS

(71) Applicant: BAE Systems Controls Inc., Endicott, NY (US)

(72) Inventors: Stephen J. Kosteva, Endicott, NY (US); Cameron R. Vakili, Binghamton, NY (US); Leslie R. Baker, Binghamton, NY (US); Stephen L. Homan, Endicott, NY (US)

(73) Assignee: BAE Systems Controls Inc., Endicott, NY (US)

( * ) Notice: Subject to any disclaimer, the term of this patent is extended or adjusted under 35 U.S.C. 154(b) by 112 days.

(21) Appl. No.: 18/067,041

(22) Filed: Dec. 16, 2022

(65) Prior Publication Data

US 2024/0206136 A1  Jun. 20, 2024

(51) Int. Cl.
*H05K 7/20* (2006.01)

(52) U.S. Cl.
CPC ..... *H05K 7/20927* (2013.01); *H05K 7/20272* (2013.01)

(58) Field of Classification Search
CPC .................. H05K 7/20927; H05K 7/20272
USPC .......................................... 165/80.4
See application file for complete search history.

(56) References Cited

U.S. PATENT DOCUMENTS

| 3,428,847 A | 2/1969 | Webb |
| 2018/0020574 A1 | 1/2018 | Pal |
| 2018/0090417 A1* | 3/2018 | Gutala ............. H01L 21/4882 |
| 2019/0214805 A1 | 7/2019 | Hiramitsu et al. |
| 2020/0051765 A1 | 2/2020 | Hiramitsu et al. |
| 2022/0094143 A1 | 3/2022 | Rai et al. |
| 2022/0142017 A1 | 5/2022 | Zhou et al. |
| 2022/0386456 A1 | 12/2022 | Isaji et al. |
| 2022/0400580 A1 | 12/2022 | Fujimura et al. |

OTHER PUBLICATIONS

International Search Report, PCT/US23/82495, mailed Mar. 22, 2024, 6 pages.
Darrah Electric Company, "Direct Water Cooled", online, Darrah Electric Company, internet <https://www.darrahelectric.com/categories/assemblies/scr-contactors/direct-water-cooled>, printed Mar. 9, 2023.

* cited by examiner

*Primary Examiner* — Joel M Attey
(74) *Attorney, Agent, or Firm* — Scully Scott Murphy & Presser PC; Gary McFaline

(57) ABSTRACT

A cooling system and method for cooling a contactor from the contactor-terminal side or both the contactor-mount side is provided. The contactors may be mounted to a base of a chassis. The cover may have one or more fluid channels associated with an exterior side of the cover. The interior side may have a plurality of thermally conductive bosses projecting from the interior surface configured to indirectly contact busbars which are respectively connected to contactor terminals of the contactors via thermal pads to provide a heat transfer path between the busbars and the fluid within the one or more fluid channels associated with the exterior side of the cover. Certain of the thermally conductive bosses are offset from the one or more fluid channels.

16 Claims, 14 Drawing Sheets

COOLING SYSTEMS AND METHODS FOR COOLING CONTACTORS

FIELD OF THE DISCLOSURE

This disclosure relates to cooling contactor(s) in a DC interface. More particularly, this disclosure relates to indirectly cooling the contactor(s) via a contactor terminal-side or both the contactor terminal-side and contactor mount-side.

BACKGROUND

In a high voltage DC interface, contactor(s) may be positioned between an external power source or sink and an internal power source or sink. A single high voltage DC interface may have a pair of contactors: one connected to a DC+ and the other connected to DC−. Each contactor has a pair of contactor terminals. A busbar may be connected to one of the contactor terminals and the external power source or sink and another busbar may be connected to the other contactor terminal and directly or indirectly to an internal distribution bus. The contactor terminals are selectively connected to each other via internal plate(s). The contactor may be normally opened and can interrupt a certain amount of current. When closed and the contactor terminals are electrically connected to each other via the plates, the contactor carries a certain amount of current and current can flow from the external power source to the internal distribution bus and vice versa (internal distribution bus to external power sink).

Contactors are rated by a manufacturer to interrupt and carry a predetermined current (rated current) at a given temperature (rated temperature) of the contactor terminals. Above the rated temperature, the ability for the contactor to carry and interrupt current deteriorates and the contactor can carry or interrupt less than the rated current. During operation, since the contactors are connected to busbars and are in proximity to other heat generating electronic components within a chassis, the contactor terminals may become hotter than the rated temperature.

SUMMARY

Accordingly, disclosed is a cooling system for contactors. Each contactor has a first end mounted to a base of a chassis and a second end having a first contactor terminal and a second contactor terminal. Two contactors form a contactor pair for a DC interface. A first contactor terminal of a first contactor of the contactor pair is connected to a first busbar and the second contactor terminal of the first contactor of the contactor pair is connected to a second busbar. The first contactor terminal of a second contactor of the contactor pair is connected to a third busbar and the second contactor terminal of the second contactor of the contactor pair is connected to a fourth busbar. The cooling system comprises a cover. The cover is configured to be mounted to sidewalls of the chassis, when mounted, the cover has an interior side facing the base of the chassis and an exterior side opposite the interior side. The cover comprises a first flow channel extending in a first direction between a first end and a second end of the cover. The first flow channel is connectable to a fluid source. At least two thermally conductive bosses project from the interior surface of the cover. A first thermally conductive boss is configured to contact the first busbar via an electrically insulating member. A second thermally conductive boss is configured to contact the second busbar via an electrically insulating member. A third thermally conductive boss is configured to contact the third busbar via an electrically insulating member. A fourth thermally conductive boss is configured to contact the fourth busbar via an electrically insulating member. Certain thermally conductive bosses are offset in a second direction from the first flow channel. The second direction is perpendicular to the first direction. The cover is thermally conductive.

In an aspect of the disclosure, one or more of the thermally conductive bosses may indirectly contact multiple busbars. For example, the first thermally conductive boss and the third thermally conductive boss may be the same thermally conductive boss and continuous between the first busbar and the third busbar.

In an aspect of the disclosure, each thermally conductive boss has a distal end. The electrically insulating member may cover the distal end. In an aspect of the disclosure, the distal end is parallel to a corresponding busbar which the thermally conductive bosses indirectly contacts.

In an aspect of the disclosure, the cover further comprises a second flow channel connected to the first flow channel. The second flow channel extends in the second direction. The second flow channel may be offset in the first direction from certain thermally conductive bosses.

In an aspect of the disclosure, the cooling system further comprises third flow channel connected to the first flow channel. The third flow channel connects the base of the chassis and the cover. The third flow channel extends in a third direction perpendicular to the first direction and the second direction. The third flow channel supplies fluid to the first flow channel. In an aspect of the disclosure, the fluid source may be upstream of the third flow channel.

In an aspect of the disclosure, the cooling system further comprises a fourth flow channel connected to the first flow channel and the second flow channel. The fourth flow channel connects the base of the chassis and the cover. The fourth flow channel extends in the third direction. The first flow channel may extend between the third flow channel and the fourth flow channel.

In an aspect of the disclosure, the base further comprises at least one chassis flow channel connected between the third flow channel and the fourth flow channel. The at least one chassis flow channel, the third flow channel and the fourth flow channel may be offset from the at least two thermally conductive bosses in the second direction. In an aspect of the disclosure, the base may be thermally conductive.

In an aspect of the disclosure, the fluid source is upstream of the third flow channel and the fluid divides to flow into the third flow channel and the at least one chassis flow channel. After flowing through the at least one chassis flow channel, the fluid flows into the fourth flow channel. In an aspect of the disclosure, the fluid flowing in the third flow channel flows into the first flow channel, and the fluid in the first flow channel merges with fluid flowing in the fourth flow channel and enters the second flow channel.

In an aspect of the disclosure, a thermally conductive material of the base, the cover and the at least two thermally conductive bosses may include an aluminum alloy.

In an aspect of the disclosure, a plurality of contactors pairs may be mounted to the chassis. Each contactor pair may be for a different DC interface. The thermally conductive bosses may indirectly contact corresponding busbars which are respectively connected to the first contactor terminal and the second contactor terminal of the contactors. In some aspects of the disclosure, the DC interface may be for different current values.

In an aspect of the disclosure, the contactors may be installed in a module of a modular power control system (MPCS). The cover may be an endcap for the MPCS and the cooling system for the contactors may be part of a cooling system for the MPCS. The third flow channel and the fourth flow channel may be manifold segments, respectively, for two common manifolds for the MPCS providing fluid between a plurality of modules of the MPCS. The first flow path may be formed from a bypass flow path for the fluid to bypass flowing into certain modules of the MPCS. The second flow path may be an outlet tube for the fluid from the MPCS.

In an aspect of the disclosure, the contactors have a specific current rating. The cooling system is configured to cool the contactors such that during operation and when the contactors are closed, the contactors carry current of at least the current rating at operating temperature.

DETAIL DESCRIPTION

In accordance with aspects of the disclosure, contactor terminals may be indirectly cooled from the contactor-terminal side or indirectly cooled from both the contactor-terminal side and the contactor mount-side.

The cover 10 may have one or more fluid tubes on an exterior side (first side of the cover). The cover 10 may also have thermally conductive boss projecting from the interior side (second side of the cover).

Figure 6:
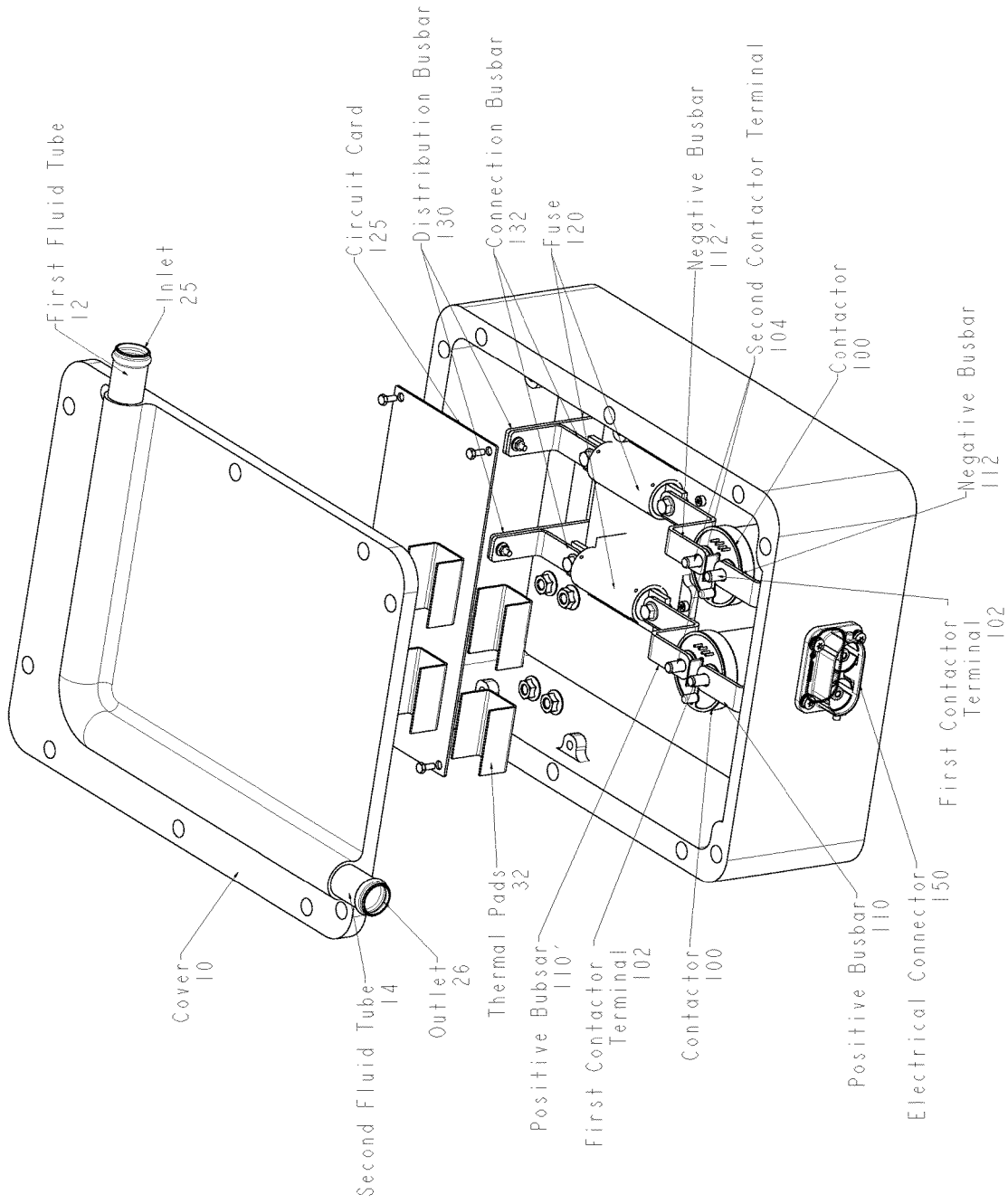
FIG. 6 illustrates an exploded view of the power unit of FIG. 5 in accordance with aspects of the disclosure.
Figure 12:
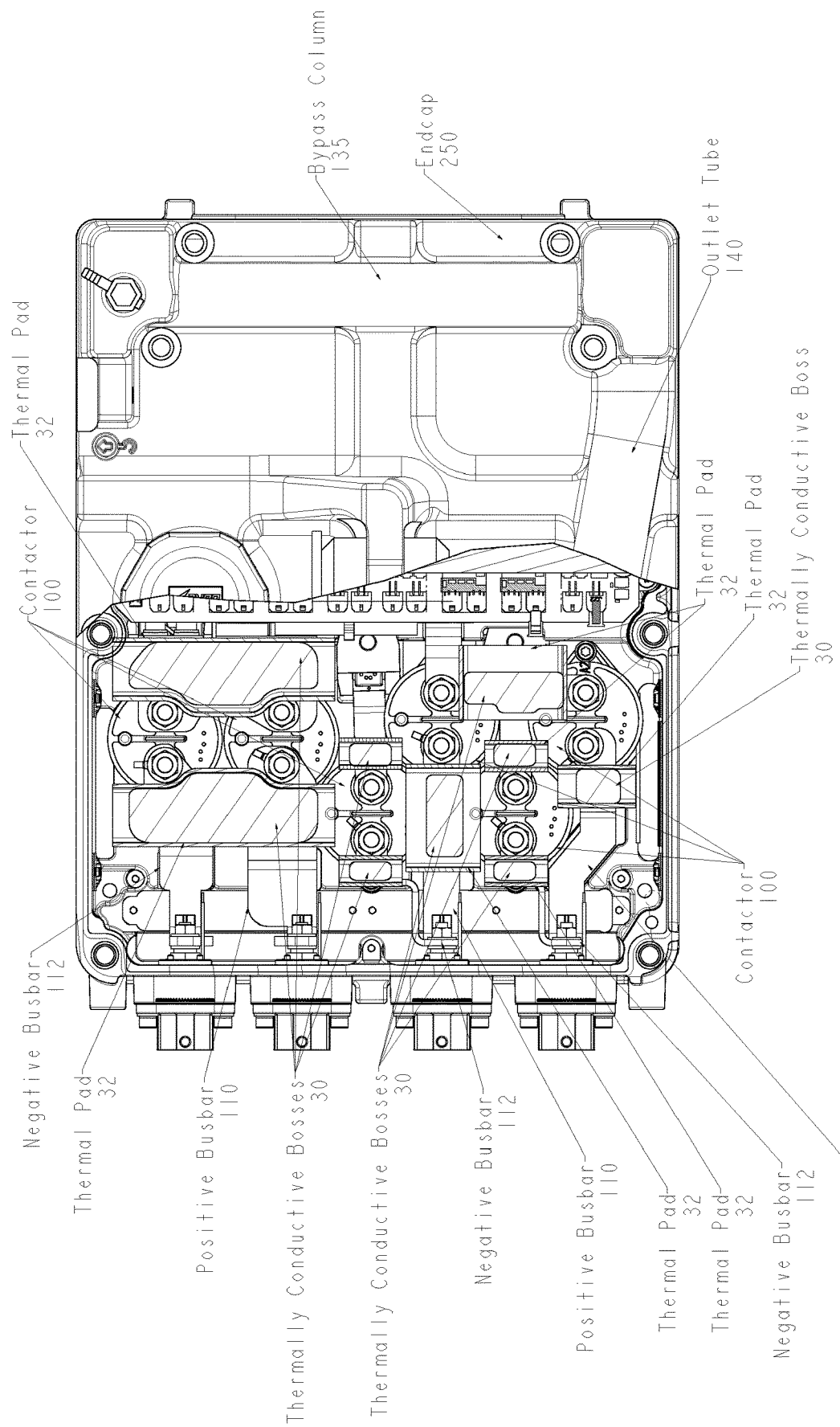
FIG. 12 illustrates a sectional view of a portion of the power module showing the contactors and the DC busbars, thermally conductive bosses and thermal pads in accordance with aspects of the disclosure.

FIG. 6 illustrates an example of a chassis 50 for a power unit having contactors 100 in accordance with aspects of the disclosure. The power unit may provide one or more high voltage (HV) DC interfaces (although only one DC interface is shown in FIG. 6). FIG. 12 illustrates a power unit (power module) having multiple HV DC interfaces. The output(s) of the HV DC interface(s) may be filtered or unfiltered. One of the sidewalls 54 has one or more openings for ports (electrical connectors 150). The electrical connectors 150 may be connected to an external power source to receive power or an external power sink to supply power via a cable(s). The external power source or external power sink may be a high voltage energy storage system or a charger. In some aspects of the disclosure, high voltage means greater than 50 V. The specific voltage of the DC interface may be application specific such as 100V, 200V, 400V, 800V etc.

A positive busbar 110 and a negative busbar 112 may be electrically connected to a respective electrical connector on one end and a first contactor terminal 102 of contactors 100, respectively, on the other end. The size and the shape of the busbars 110, 112 may be based on the magnitude of the current being carried. Another positive busbar 110' and negative busbar 112' may be electrically connected to a second contactor terminal 104 of the contactors 100, respectively, on one end and a fuse 120 on other end. The fuse 120 may be connected to the base 52 of the chassis 50 via a fuse holder 122 (illustrated in FIGS. 4 and 5).

Figure 4:
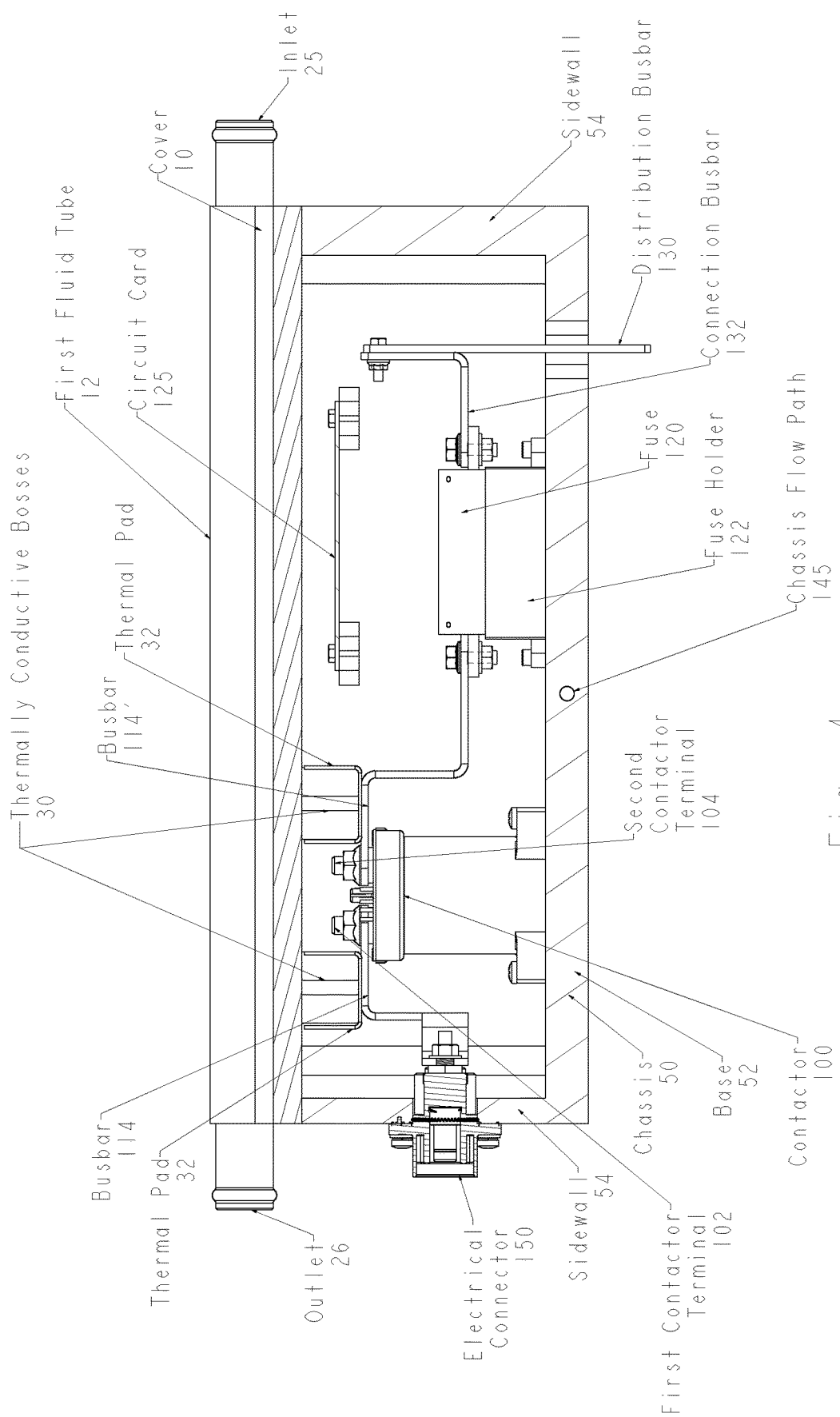
FIG. 4 illustrates a sectional view of a power unit having one or more heat transfer paths in accordance with aspects of the disclosure having the cover of FIG. 1.
Figure 5:
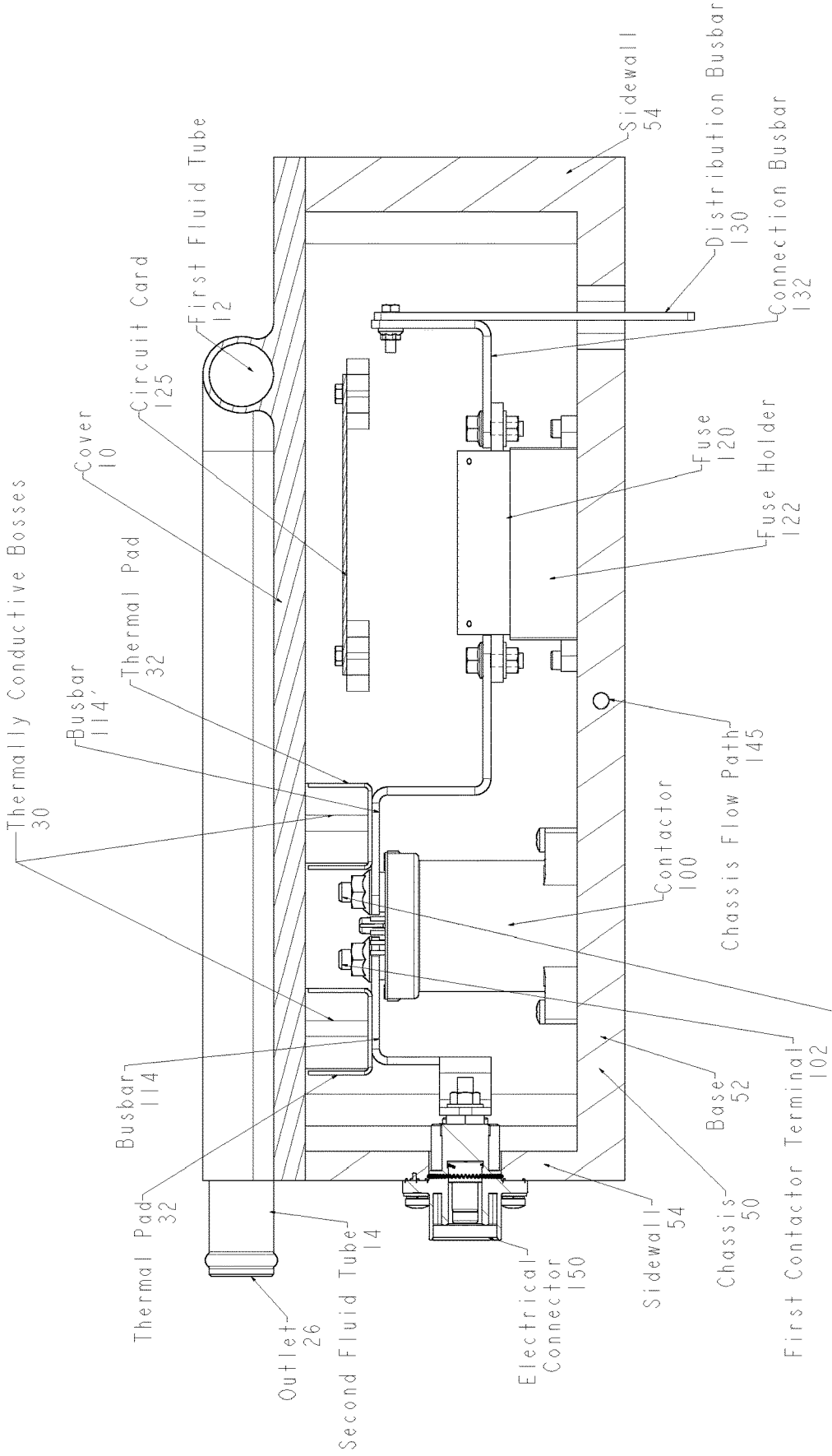
FIG. 5 illustrates a sectional view of a power unit having one or more heat transfer paths in accordance with other aspects of the disclosure having the cover of FIGS. 2 and 3.

Each contactor 100 may have an outer wall. The outer wall may be made of plastic. Each contactor 100 has the first contactor terminal 102 and the second contactor terminal 104. The first contactor terminal 102 and the second contactor terminal may be selectively connected to each other via conductive plates. The contactor 100 may have an actuator that may connect the conductive plates to each other or to isolate the conductive plates. The actuator may include a spring plunger and coil(s). The contactor 100 may be controlled using a driver circuit on a circuit card 125. The circuit card 125 may be mounted to sidewalls 54 of the chassis 50. As shown in FIGS. 4 and 5, the contactors 100 may be mounted to a base 52 of the chassis 50 (components other than the contactor terminals are not shown in FIGS. 4 and 5).

During operation, the busbars 110, 110', 112, 112' and contactor terminals 102, 104 generate heat. The primary heat flow path within the contactor 100 is toward the contactor terminal-side. Therefore, in accordance with aspects of the disclosure, a cooling system indirectly cools the contactor terminals 102, 104 from at least the contactor terminal-side.

Figure 3:
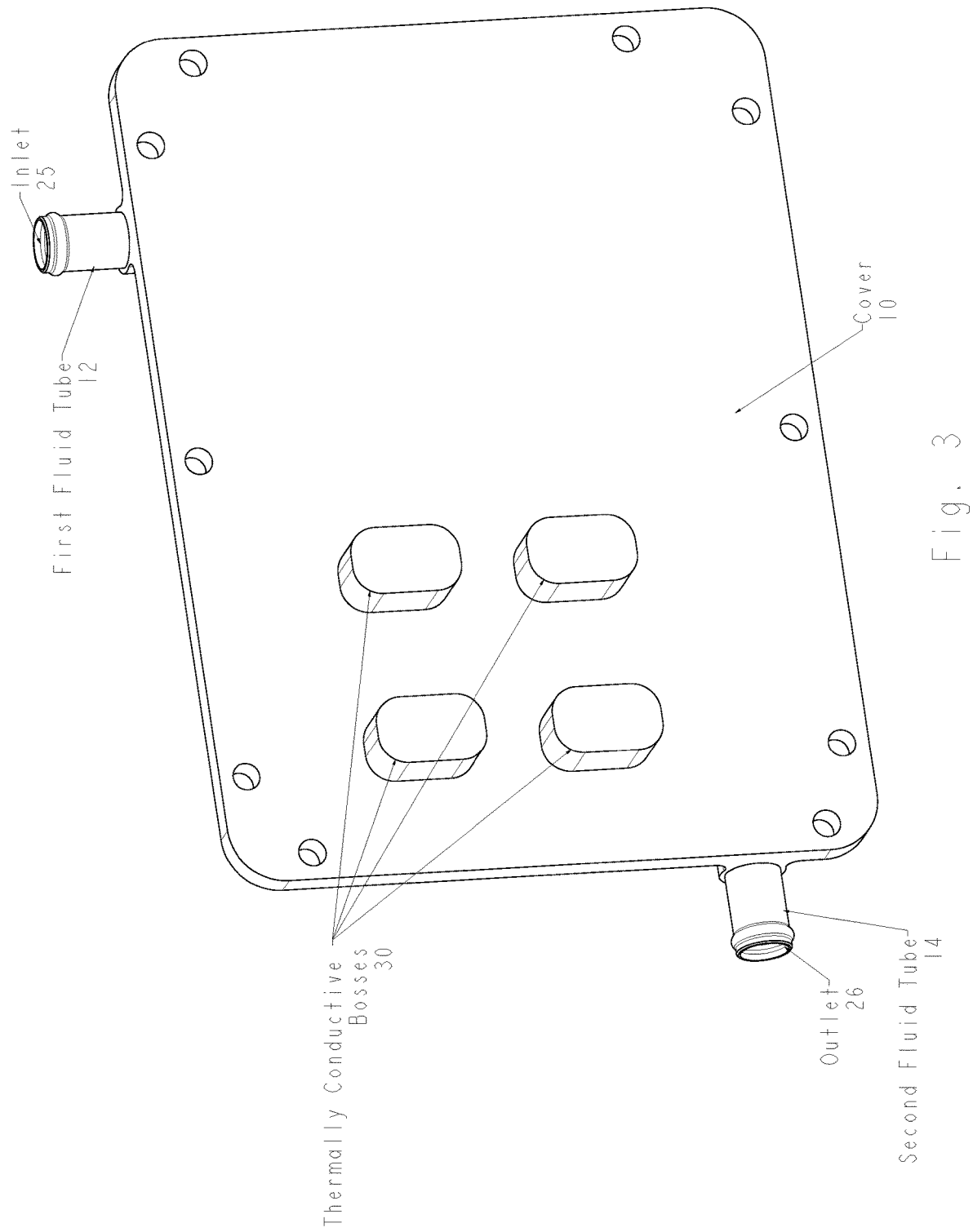
FIG. 3 illustrates an opposite side of the cover of FIG. 2 showing thermally conductive bosses projecting from the interior surface of the cover for contacting with busbars via thermal pads in accordance with aspects of the disclosure.

In accordance with aspects of the disclosure, the interior surface of the cover 10 has thermally conductive bosses 30 as illustrated in FIG. 3. FIG. 3 illustrates an example of a cover 10 in accordance with aspects of the disclosure showing the interior surface. The thermally conductive bosses 30 are positioned to contact the positive busbar 110, 110', and negative busbars 112, 112' adjacent to the first contactor terminal 102 and the second contactor terminal 104 (via thermal pads 32). As illustrated in FIG. 3, there are four thermally conductive bosses 30, one per busbar 110, 110', 112, 112' (the four busbars are illustrated in FIG. 6 corresponding to the four thermally conductive bosses 30).

Thermally conductive, electrically insulating pads 32 (thermal pads) may be positioned between the thermally conductive bosses 30 and the positive busbars 110, 110' and negative busbars 112, 112'. The thermal pad 32 may be a silicone-based pad. When the cover 10 is mounted to the chassis 50, the distal surface of the thermally conductive bosses 30 contacts the busbars 110, 110', 112, 112' via the thermal pads 32 as illustrated in FIG. 4 and FIG. 5. In the sectional views illustrated in FIGS. 4 and 5, elements with the hashing are elements where the cut for the view is made (aligned) and elements without the hashing are offset from the cut. In some aspects of the disclosure, the distal surfaces of the thermally conductive bosses 30 may be parallel to the busbars 110, 110', 112, 112' to maximize the surface contact and high transfer path.

Figure 1:
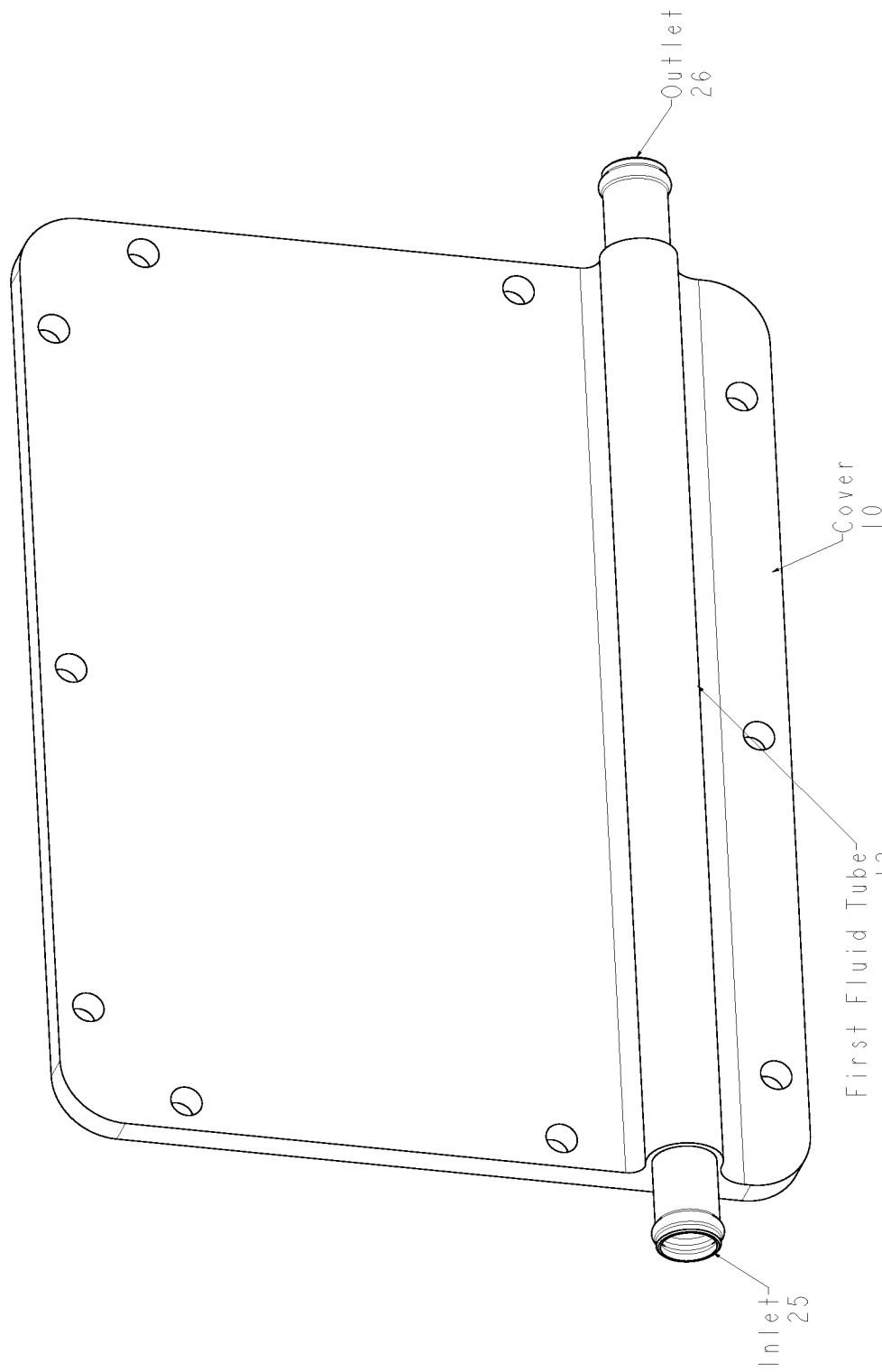
FIG. 1 illustrates an example of a cover having a fluid tube in accordance with aspects of the disclosure.

FIG. 1 illustrates another example of the cover 10 in accordance with aspects of the disclosure showing the exterior. The conductive bosses 30 may be in a similar position as shown in FIG. 3 in the cover 10 of FIG. 1. The exterior surface has a first fluid tube (fluid channel) 12. The first fluid tube 12 has an inlet 25 and outlet 26. The inlet 25 may be connected to a fluid source and a pump. The fluid source may be a fluid reservoir. The outlet 26 may be connected to the fluid reservoir to return the fluid.

In an aspect of the disclosure, the cover 10 is also made of a thermally conductive material. In some aspects of the disclosure, the cover 10 may be made of the same material as the thermally conductive bosses 30. The material may be a non-ferrous metal. For example, the cover 10 may be made from aluminum (aluminum alloy), copper, nickel, gold, or silver. Advantageously, since the cover 10 is made of a thermally conductive material, the first fluid tube 12 does not have to be aligned with the thermally conductive bosses 30. In an aspect of the disclosure, the first fluid tube 12 may extend in a first direction. In some aspects of the disclosure, the first fluid tube 12 may be near an edge of the cover 10. There may be a space between the first fluid tube 12 and the edge to ensure the first fluid tube 12 is sealed (clearance) and to provide a space for the openings for mounting hardware to mount the cover 10 to sidewalls 54 of the chassis 50. FIG. 1 illustrates the first fluid tube 12 extending in a specific direction such as a first direction (example of first direction). However, the extending direction is not limited to the first direction, and the first fluid tube 12 may extend in a second direction, which is perpendicular to the first direction. The first fluid tube 12 may extend in other directions to maintain a certain length for the heat transfer path across the cover 10. The heat transfer path is longer when the first fluid tube 12 extends in the first direction than when the first fluid tube 12 extends in a second direction.

In an aspect of the disclosure, the first fluid tube 12 may be offset from certain of the thermally conductive bosses 30 in the second direction.

FIG. 4 illustrates a sectional view illustrating the cover 10 shown FIG. 1 mounted to the chassis 50. The busbars connected to the contactor terminals 102, 104 in FIG. 4 (and FIG. 5) are labeled 114, 114' since one pair is shown. A heat transfer path is between the busbars 114, 114' (shown in FIG. 4) (e.g., positive busbars 110, 110', negative busbars 112, 112'), the thermal pads 32, the thermally conductive bosses 30, the cover 10 to the first fluid tube 12 (and fluid). This heat transfer path indirectly cools the first contactor terminal 102 and the second contactor terminal 104 of the contactor 100. Heat from the first contactor terminal 102 and the second contactor terminal 104 is transferred to the busbars 110, 110', 112, 112', which in turn is transferred via the above heat transfer path.

Figure 2:
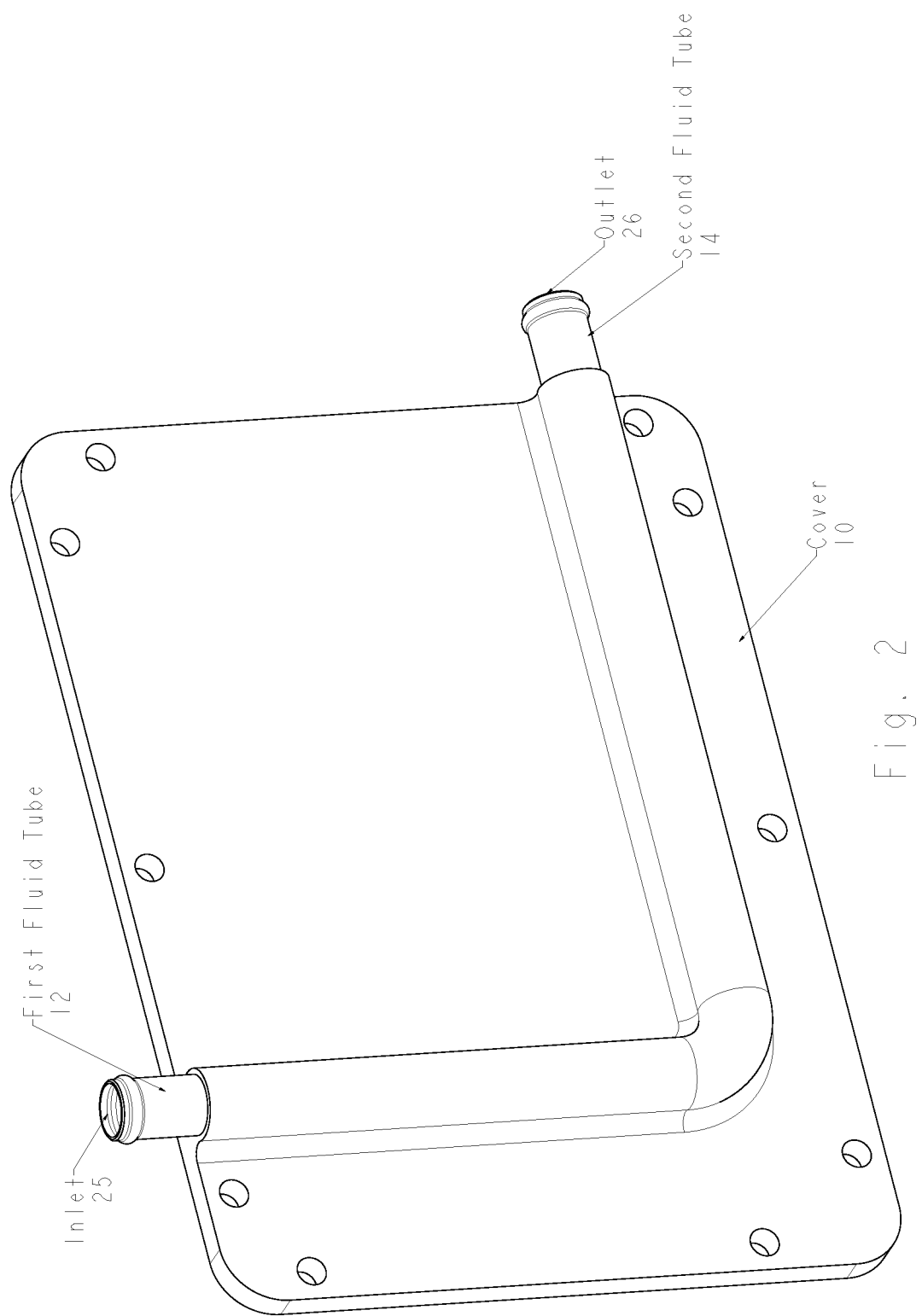
FIG. 2 illustrates an example of a cover having multiple fluid tubes in accordance with other aspects of the disclosure.

FIG. 2 illustrates a view of the exterior side of the cover 10 having multiple fluid tubes. For example, the cover 10 may have a first fluid tube 12 and a second fluid tube 14. In an aspect of the disclosure, the first fluid tube 12 and the second fluid tube 14 may form a continuous fluid path for the fluid between the inlet 25 and outlet 26. The fluid tubes 12, 14 may extend in different directions. For example, the first fluid tube 12 extends in a first direction and the second fluid tube 14 extends in the second direction (note that the first direction may be different in FIG. 2 then in FIG. 1). The first fluid tube 12 may be offset from the thermally conductive bosses 30 in the second direction and the second fluid tube 14 is offset from the thermally conductive bosses 30 in the first direction. As illustrated in FIG. 3, each thermally conductive bosses 30 are offset from both the first fluid tube 12 and the second fluid tube 14. However, in other aspects of the disclosure, most of the thermally conductive bosses 30 may be offset, with some of the thermally conductive bosses 30 being aligned with the fluid.

FIG. 5 illustrates a sectional view illustrating the cover 10 shown FIGS. 2 and 3 mounted to the chassis 50. As shown FIG. 5, there is a heat transfer path between the busbars 110, 110', 112, 112', the thermal pads 32, the bosses 30, the cover 10 to the first fluid tube 12 and the second fluid tube 14 (and fluid). This heat transfer path indirectly cools the first contactor terminal 102 and the second contactor terminal 104 of the contactor 100. Heat from the first contactor terminal 102 and the second contactor terminal 104 is transferred to the busbars 110, 110', 112, 112', which in turn is transferred via the above heat transfer path.

The base 52 may be connected to all sidewalls 54 as illustrated. However, the shape of the base 52 and connection to sidewalls 54 may be based on the components mounted within the chassis 50. For example, depending on the application, the chassis 50 may also comprise additional components such as a filter to provide a filtered output. The filter may comprise common mode and differential module filtering including inductors, three-wire choke and resistance. The filter may be mounted to one or more sides of the base 52 such as via a coldplate cover. In this aspect of the disclosure, the base 52 may have two levels, where the levels are separate (although the base 52 is shown in the figures as being flat).

In an aspect of the disclosure, in addition to indirectly cooling the first contactor terminal 102 and the second contactor terminal 104 from the contactor terminal-side, there may be another fluid channel in the base 52 of the chassis 50 such as shown in FIGS. 4 and 5 (chassis flow path 145). In some aspects of the disclosure, the base 52 may have a thickness such that the chassis flow path 145 is contained with the base 52 (such as a tube). In other aspects of the disclosure, the base 52 may have a recess to form a channel (with branches) and the channel(s) may be covered by a coldplate cover. The specific direction(s) of the chassis flow path 145 may be application specific and may be based on the heat generating components within the chassis 50. The base 52 of the chassis 50 may also be made of a thermally conductive material. Advantageously, since the base 52 is made of the thermally conductive material, the chassis flow path 145 may be offset from the contactors 100 in the second direction and still provide a heat transfer path. This also allows the chassis flow path 145 to be aligned with other heat generating components. The heat transfer path is from the contactor terminals 102, 104 through the contactor 100, to the base 52 though a portion of the base 52 to the chassis flow path 145. While the heat transfer path on the contactor terminal-side of the contactors 100 is more efficient in cooling the contactor terminals 102, 104, the heat transfer path on the contactor mount-side does provide an additional cooling.

In some aspects of the disclosure, the chassis flow path 145 may have a separate fluid source from the fluid source for channels in the cover 10. The fluid source may be connected to an opening in the base 52 (inlet). The fluid may flow to another opening in the base (outlet) and into a fluid reservoir in a similar manner as described above.

In other aspects, the chassis flow path 145 and the flow path(s) in the cover may have the same fluid source as will be described later.

In some aspects of the disclosure, the power unit may be a standalone unit. For example, the power unit may also include components for converting DC into AC such as for powering an electric machine. The components may include semiconductor switches, drive circuitry and AC busbars. The chassis flow path 145 may be include one or more branches. Some of these heating generating components may be aligned with the branches.

In other aspects of the disclosure, the power unit(s) described herein may be one or more modules of a power system. For example, the power unit may be connected to other modules via a distribution bus 130. The distribution bus 130 may be electrically connected to the busbars 110', 112' via a connection busbar 132 and respective fuses 120.

The power system may be a modular power control system (MPCS). A MPCS is a modular line replaceable unit (LRU) containing a plurality of inverters modules and high voltage power distribution. The MPCS is scalable and customizable to have any number of inverters modules and current interfaces. The current interfaces may be in a DC interface module(s), a DC filter module(s) or a junction module(s). The power unit described herein may be one of these modules.

The DC interface module may have a plurality of DC interfaces configured to receive DC power from an external source. The DC interface module may also include isolation monitoring and control of high voltage power distribution and low voltage power distribution in the MPCS.

The DC interfaces may include the busbars 112, 112', 114, 114' described above with the contactors 100.

The DC junction module may comprise a plurality of DC interfaces. The interfaces may be unfiltered. Each interface may comprise a fuse, contactor(s), voltage and/or current sensors or some combination thereof. In some aspects of the disclosure, each DC junction module may comprise 4 different interfaces. However, the number of interfaces is not limited to 4.

The MPCS may also comprise a control module having hardware for controlling the inverter modules. Different inverter modules may support or provide different phases of power. In a single-phase out inverter module, outputs of multiple pairs of semiconductor switches are connected in parallel to provide the single-phase out. In some aspects of the disclosure, different hardware may be used to control N-phase out inverter modules and multiple single-phase out inverter module.

The number different modules, the number of each type of module and the specific position of the modules within the MPCS may be application specific. The MPCS may be installed in a vehicle such as a battery electric vehicle (BEV) or a hybrid electric vehicle (HEV). In some aspects of the disclosure, when used in an HEV, the DC junction module and/or the DC filter module may be omitted. The vehicle may be a personal vehicle, such as a scooter, car, motorcycle and truck or a commercial vehicle such as a truck or bus, a maritime vehicle such as a boat or submarine or a military vehicle such as a tank, self-propelled artillery, or troop transport. The vehicle may also be an airplane, a helicopter, UAV and other powered air vehicles. Larger vehicles may require more power and thus more interfaces and modules.

When the power unit described herein is positioned at the end of the MPCS, the cover 10 is also an endcap 250 for the MPCS.

FIG. 12 illustrates an example of a DC filter module (an example of the power unit) for a MPCS with a cooling system in accordance with aspects of the disclosure. In FIG. 12, the endcap 250 is partially removed to show the high voltage DC interfaces, the thermally conductive bosses 30 and thermal pads 32 (sectional view). In the example illustrated in FIG. 12, there are three DC interfaces. However, the number of DC interfaces is not limited to three. One or more of the high voltage DC interfaces may be configured for different current levels. For example, one of the high voltage interfaces may be configured for a first current and a second of the high voltage DC interfaces, may be configured for a second current, where the second current is less than the first current. For example, one of the high voltage DC interfaces may be used for high-speed charging such as supporting about 600A. This may be used for opportunity charging. This DC interface is illustrated where the contactors 100 for DC+ and DC− are aligned.

Other high voltage DC interfaces may support a current of about 300A. These two DC interfaces may be used for overnight charging. These two DC interfaces are illustrated with the contactors 100 for the respective DC+ and DC− being offset.

The positive busbars 110, 110' and negative busbars 112, 112' for the higher current DC interface may be thicker and wider than the corresponding positive busbars 110, 110' and negative busbars 112, 112'. Also for the higher current DC interface, there is a separate connectors 150 for the DC+ and DC− whereas for the lower current DC interfaces, the DC+/DC− connects to the same electrical connector 150.

Since the contactors 100 are at different relative positions with respect to the electrically connectors 150, the shape of the different busbars 110, 112 may be different. For example, one of the lower current positive busbars 110, has a zig-zag shape.

In accordance with aspects of the disclosure, the first contactor terminals 102 and the second contactor terminals 104 of the contactors 100 in the DC filter module may be indirectly cooled from the contactor terminal-side and the contactor mount-side.

Figure 9:
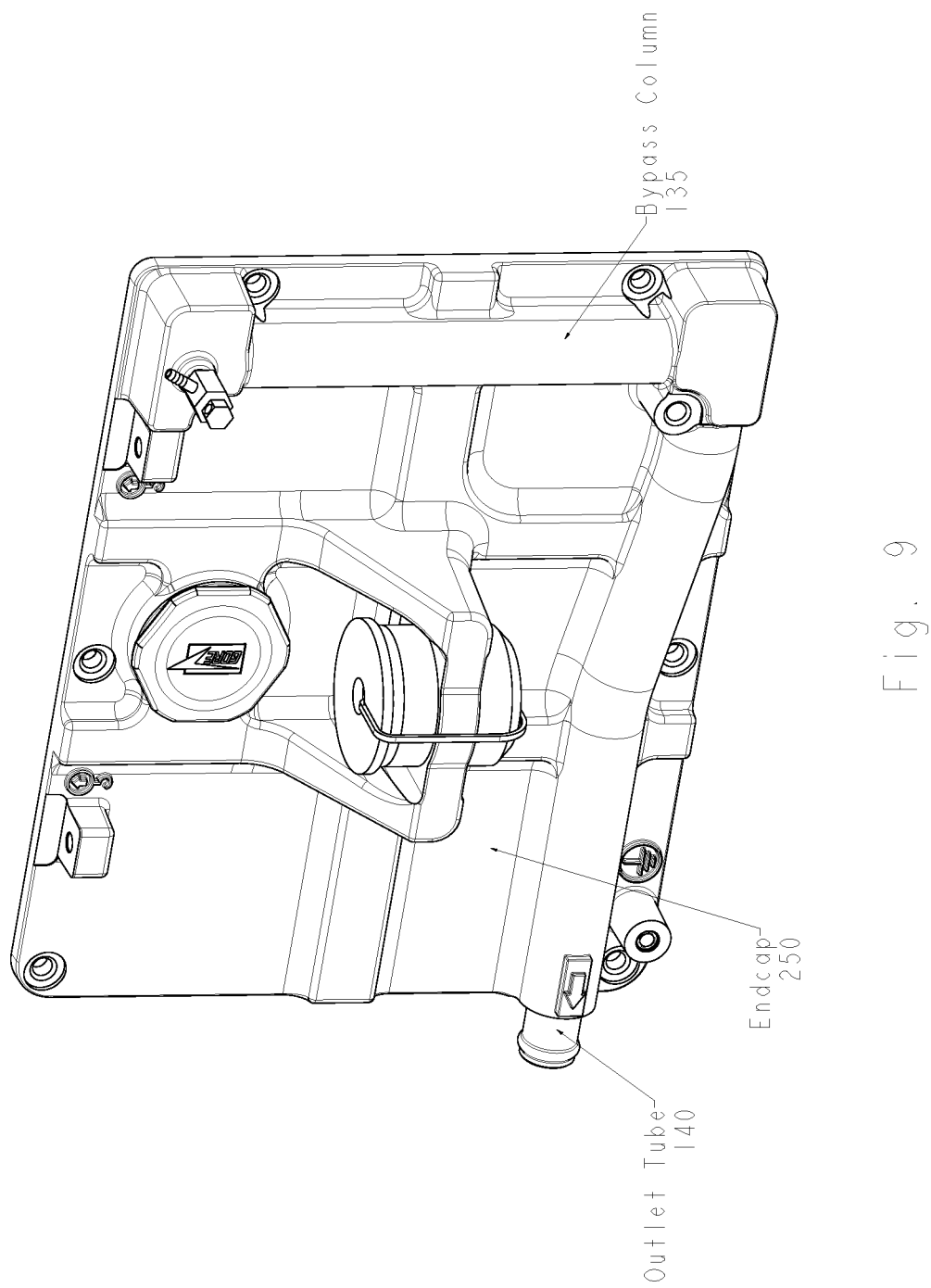
FIG. 9 illustrates an exterior side of the endcap shown in FIGS. 7 and 8 showing the flow bypass column and the outlet tube in accordance with aspects of the disclosure.
Figure 10:
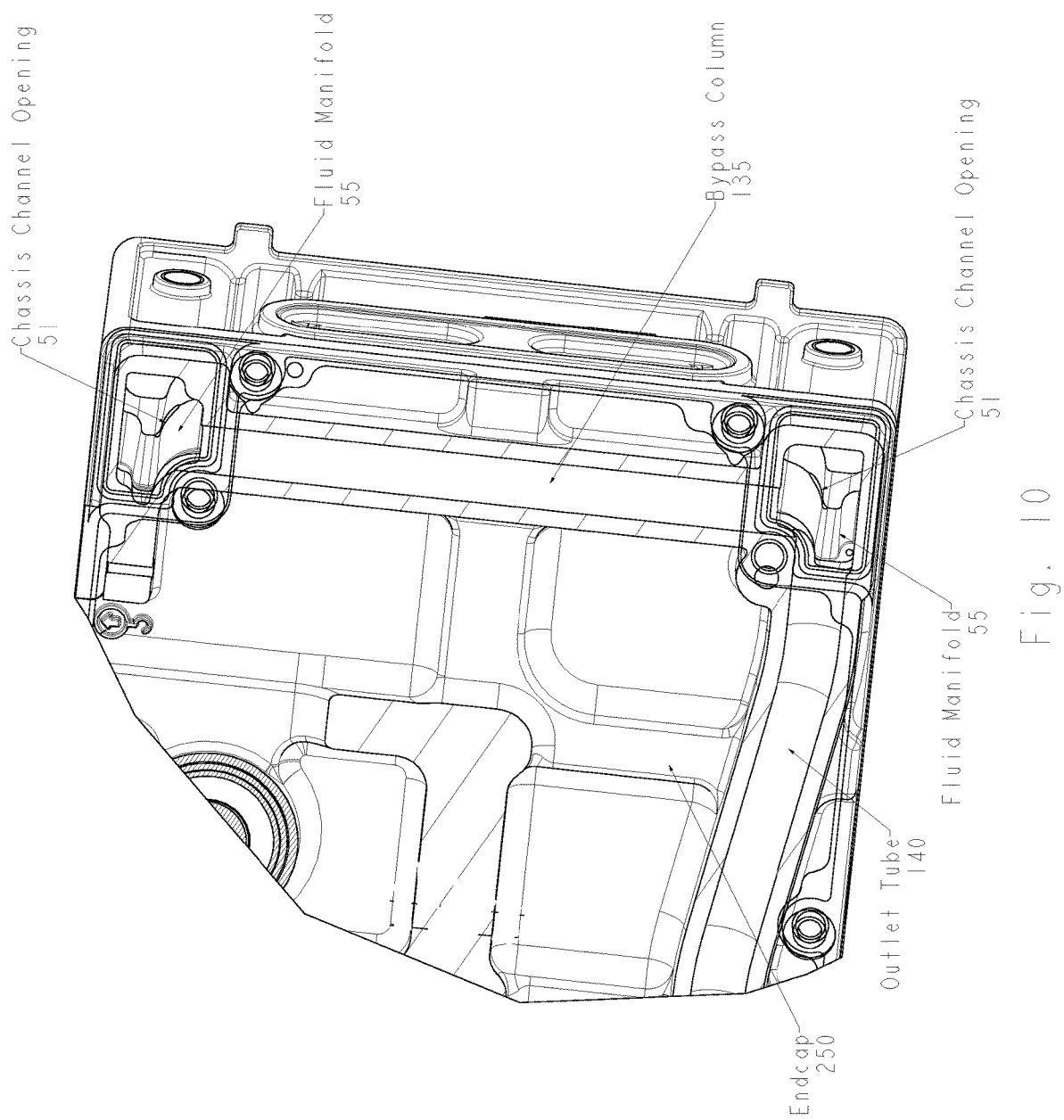
FIG. 10 illustrates partial sectional perspective view of a power module in accordance with aspects of the disclosure where the endcap is attached to the chassis of the power module where the figure shows the two fluid channels orthogonal to the endcap connected to chassis channel openings, respectively.

The endcap 250 may have a bypass column 135 (an example of a first fluid tube) and an outlet tube 140 (an example of a second fluid tube) as shown in FIG. 9. The bypass column 135 is connected to the outlet tube 140 to provide a continuous fluid path. In an aspect of the disclosure, the bypass column 135 and the outlet tube 140 may be in a similar position as the first fluid tube 12 and the second fluid tube 14, respectively. The bypass column 135 fluidly connects two additional fluid paths in the DC filter module. The two additional fluid paths are substantially perpendicular to the endcap 250. Two fluid manifolds 55 extend from the base 52 to the endcap 250 (e.g., an upper manifold and a lower manifold). The two fluid manifolds 55 are illustrated in FIG. 10. As will be described later, these two fluid manifolds 55 may be common manifold segments of common manifolds (upper common manifold 219, lower common manifold 217). The base 52 may have an opening corresponding to the two fluid manifolds 55. The two fluid manifolds 55 may be formed from at least one outer sidewall 54 of the chassis 50 and an inner chassis wall.

An open end of the outlet tube 140 may have the outlet 26. The outlet 26 may be connected to tubes, pipes (such as 1415B) for outputting of fluid to a cooling fluid reservoir 1405. The outlet tube 140 may extend from a rear of the cover to a front of the endcap 250. The outlet tube 140 may be curved to connected with a manifold outlet (which may be a common manifold outlet) (not labeled) at an end of a fluid manifold (which may be a common manifold). The manifold outlet is the interface between fluid path in the fluid manifold 55 and the fluid paths in the endcap 250.

The fluid may be divided into paths in the endcap 250 (e.g., outlet tube 140 and bypass column 135) and into DC filter module flow path 220D. In an aspect of the disclosure, an orifice plate 160 may be inserted between the chassis 50 and the endcap 250. A portion of the endcap 250 facing the end of the fluid manifold 55 or the end of the fluid manifold 55 facing the endcap 250 may comprise a shelf or slit 45 for the orifice plate 160. The endcap 250 also has a cutout (not labeled) for a sealing elastomer such as an o-ring. The o-ring provides a fluid seal between the chassis 50 and the endcap 250. The orifice plate 160 may be positioned in the chassis 50 or the endcap 250.

Figure 7:
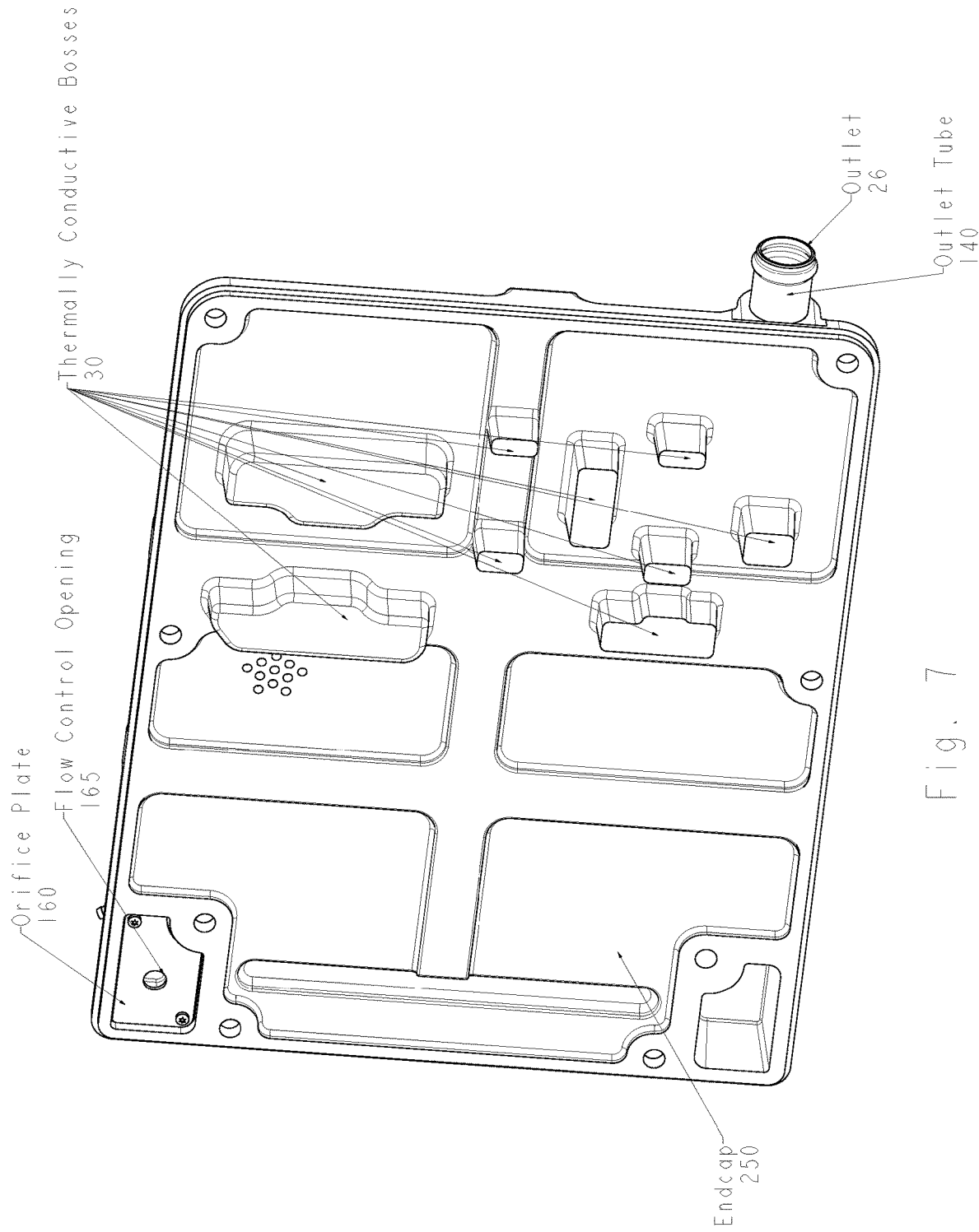
FIG. 7 illustrates an example of a endcap in accordance with aspects of the disclosure showing thermally conductive bosses projecting from the interior surface of the endcap for contacting busbars via thermal pads accordance with aspects of the disclosure without the thermal pad and an orifice plate inserted in a fluid manifold in accordance with aspects of the disclosure.

The orifice plate 160 has a flow control opening 165. This flow control opening 165 may be in the central portion of the orifice plate 160. The size (diameter) of the opening may control the flow rate/volume such as in liters-per-minute into the different fluid paths. FIG. 7 illustrates the orifice plate 160 connected to a shelf in the endcap 250 and facing the upper fluid manifold (which may be an upper common manifold) in some configurations. There may also be an opening into the bypass column 135 (flow bypass column opening 137). This opening 137 is illustrated in FIG. 8 (a view of the interior side of the endcap 250).

The bypass column 135 (flow bypass column opening 137) and the orifice plate 160 may control a flow rate/volume of fluid into the fluid paths in the endcap 250 and the fluid path within the chassis 50 (and as will be discuss later, into certain other modules).

Figure 8:
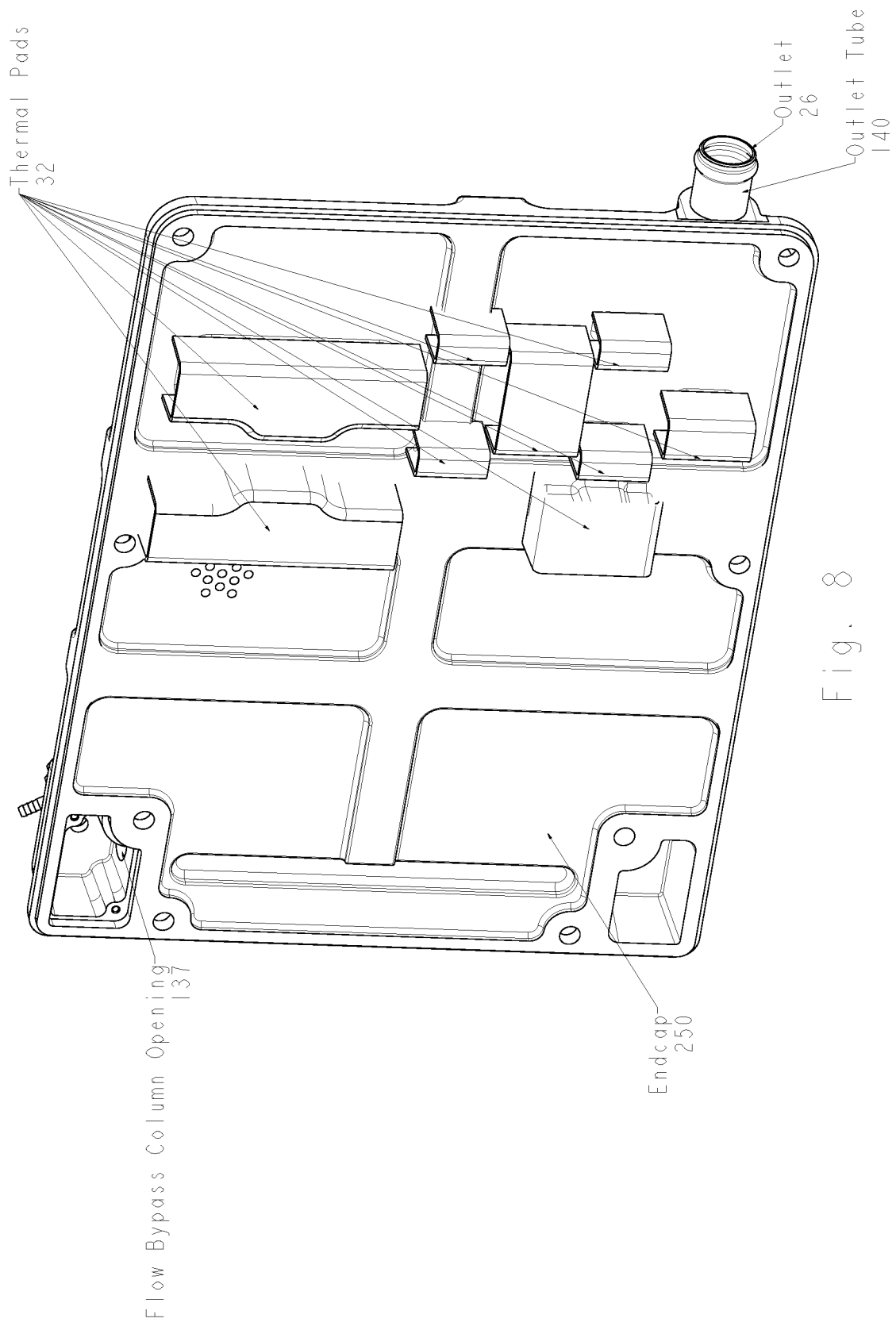
FIG. 8 illustrates the endcap of FIG. 7 with the thermal pad but without the orifice plate to show the flow bypass column opening.

As illustrated in FIGS. 7 and 8, the interior surface of the endcap 250 has a network of thermally conductive bosses 30 projecting from the interior surface in a similar manner as described above. The thermally conductive bosses 30 are shown in FIG. 7 without thermal pads 32 and are covered with thermal pads 32 in FIG. 8. The position of these thermally conductive bosses 30 corresponds to the position of the positive busbars 110, 110' and the negative busbars 112, 112' and in particular where the busbars 110, 110', 112, 112' are adjacent to the first contactor terminals 102 and the second contactor terminals 104, respectively (see FIG. 12). In an aspect of the disclosure, the same thermally conductive boss 30 may contact multiple busbars 110, 112, 110', 112' via the thermal pad 32. For example, for the higher current interface, the same thermally conductive boss 30 may contact the busbar 110, 112 connected to the first contactor terminal 102 (via the thermal pad 32) and another same terminally conductive boss 30 may contact the busbar 110', 112' connected to the second contactor terminal 104 (via the thermal pad 32) such as shown in FIG. 12.

The surface area of the thermal pads 32 is greater than the surface area of the distal surface of the corresponding thermally conductive boss 30. This is to insure electrical isolation between the thermally conductive boss 30, the first contactor terminal 102, the second contactor terminal 104 and busbars, 110, 110', 112, 112'.

Figure 11:
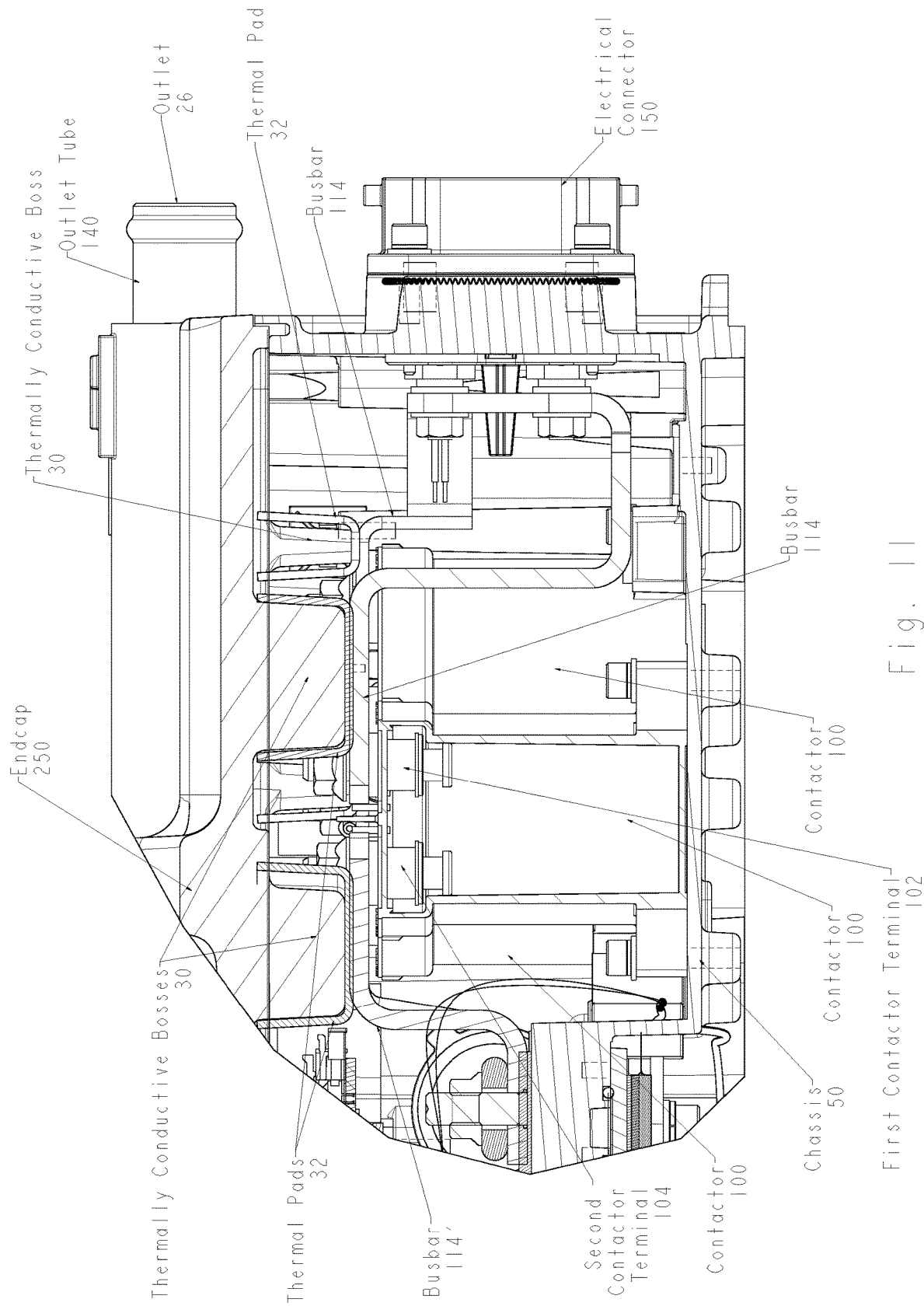
FIG. 11 illustrates a sectional view of a portion of a power module in accordance with aspects of the disclosure showing a terminal-side heat transfer path in accordance with aspects of the disclosure.

FIG. 11 illustrates a sectional view of a portion of the DC filter module (example of power unit) in accordance with aspects of the disclosure. Once again, the hashed lines illustrate elements aligned with the sectional cut. FIG. 11 illustrates the thermally conductive bosses 30 in contact with busbars 114, 114' (generically identified to refer to both positive and negative busbars) via the thermal pads 32. FIG. 11 illustrates the thermal pads 32 surrounding the thermally conductive bosses 30. In FIG. 11, several of the bosses 30 and thermal pads 32 are hidden, however, FIG. 12 illustrates nine thermally conductive bosses 30 connected to the respective busbar(s) 110, 110', 112, 112' via the thermal pads 32.

FIGS. 7 and 8 illustrate most of the thermally conductive bosses 30 offset from the outlet tube 140 (in the example, one of the thermally conductive bosses 30 is aligned with the outlet tube 140). The thermally conductive bosses 30 are offset from the bypass column 135. The endcap 250 is made of a thermally conductive material. Since the endcap 250 is made of a thermally conductive material, heat may be transferred between the busbars 110, 110', 112, 112', thermal pads 32, thermally conductive bosses 30, the endcap 250 and to the fluid paths (e.g., bypass column 135 and the outlet tube 140) even though the thermally conductive bosses 30 may be offset from the fluid path(s). Advantageously, by having the endcap 250 made of a thermally conductive material, the locations of the busbars 110, 110', 112, 112', the thermally conductive bosses 30, the contactors 100 is not limited to being in the flow path (aligned with either the outlet tube 140 or the bypass column 135).

The contactors 100 may also be cooled via the contactor mount-side. The fluid manifolds 55 (which may be common manifolds in some configurations) have a chassis channel opening 51 (which may be a common manifold opening in some configurations), respectively. The chassis channel openings 51 provide a fluid interface region between the fluid manifolds 55 and a DC filter module flow path 220D (example of chassis flow path 145).

The DC filter module flow path 220D is a path between respective chassis channel openings 51. One of the chassis channel openings 51 acts as the inlet for the DC filter module flow path 220D and the other acts as the outlet for the DC filter module flow path 220D. The shape, the number of branches, and the flow direction may be based on the number, type and location of heat generating components within the DC filter module. The DC filter module comprises a plurality of electronic components that may require cooling, such as filter inverters, a three-wire choke, PCB including high-power resistors, fuses 120, busbars 110, 110', 112, 112' and contactors 100. Certain of these electronic components are mounted in alignment with the fluid path (e.g., direct fluid pathway). These components may be the filter inverters and three-wire choke. Since the base 52 is thermally conductive, the fuses 120, the busbars 110, 110', 112, 112' and contactors 100 are not aligned with the flow path 220D such that other heat generating components may be aligned.

Figure 13:
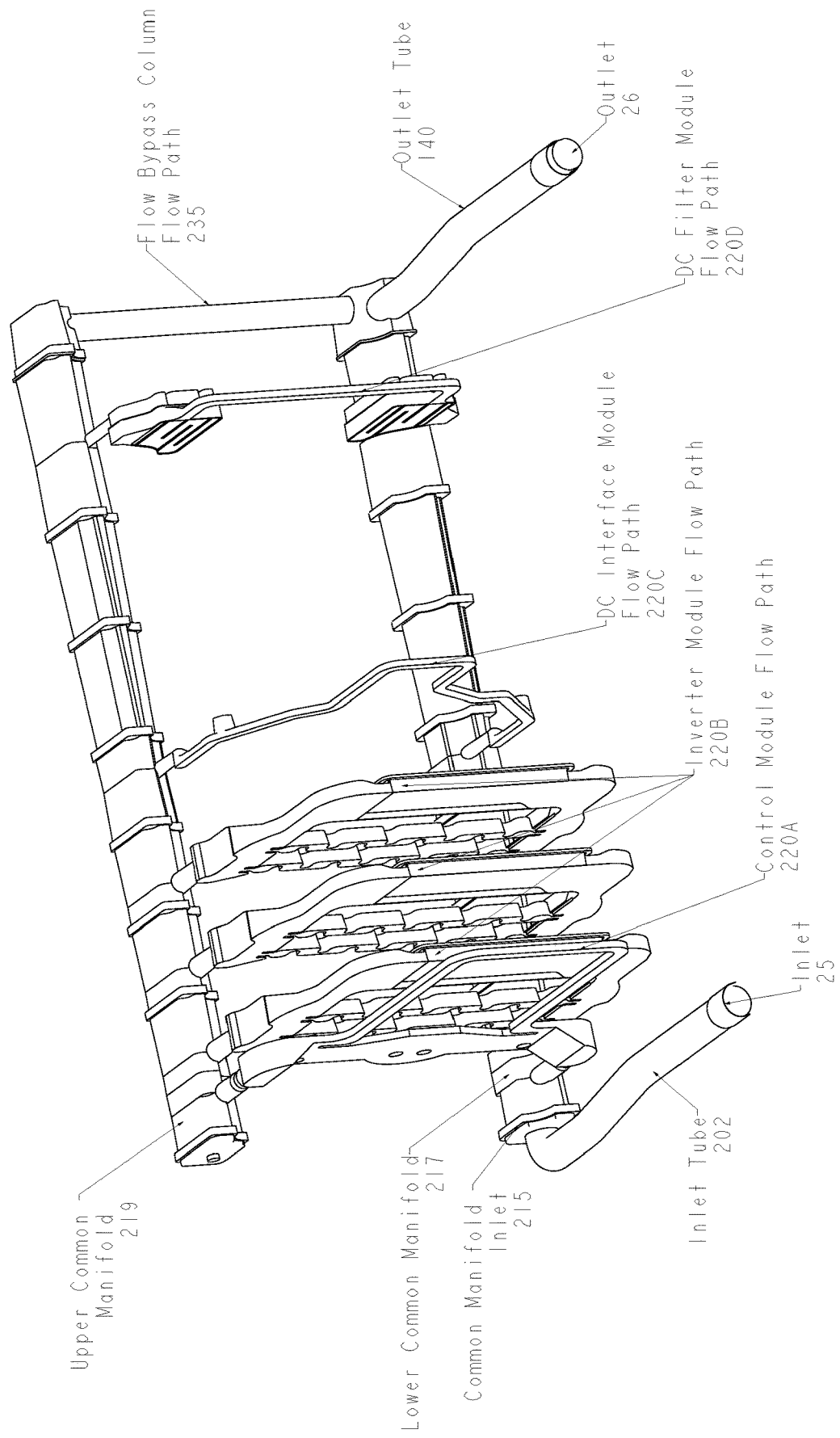
FIG. 13 illustrates an example of common manifolds for a modular power control system having one or more power module in accordance with aspects of the disclosure and module specific flow paths between ends of the modular power control system.

An example of the DC filter module flow path 220D is illustrated in FIG. 13 and also described in co-pending U.S. application Ser. No. 18/067,025 entitled "Cooling System with Common Modular Manifolds," filed on Dec. 16, 2022. The contents of which is incorporated by reference.

The DC filter module flow path 220D has two serpentine paths and connection portion. The two serpentine paths may have two levels. The DC filter module flow path 220D (and any branches) may be formed from recesses in the base 52 and a coldplate cover. Certain components may be directly mounted to the coldplate cover.

Figure 14:
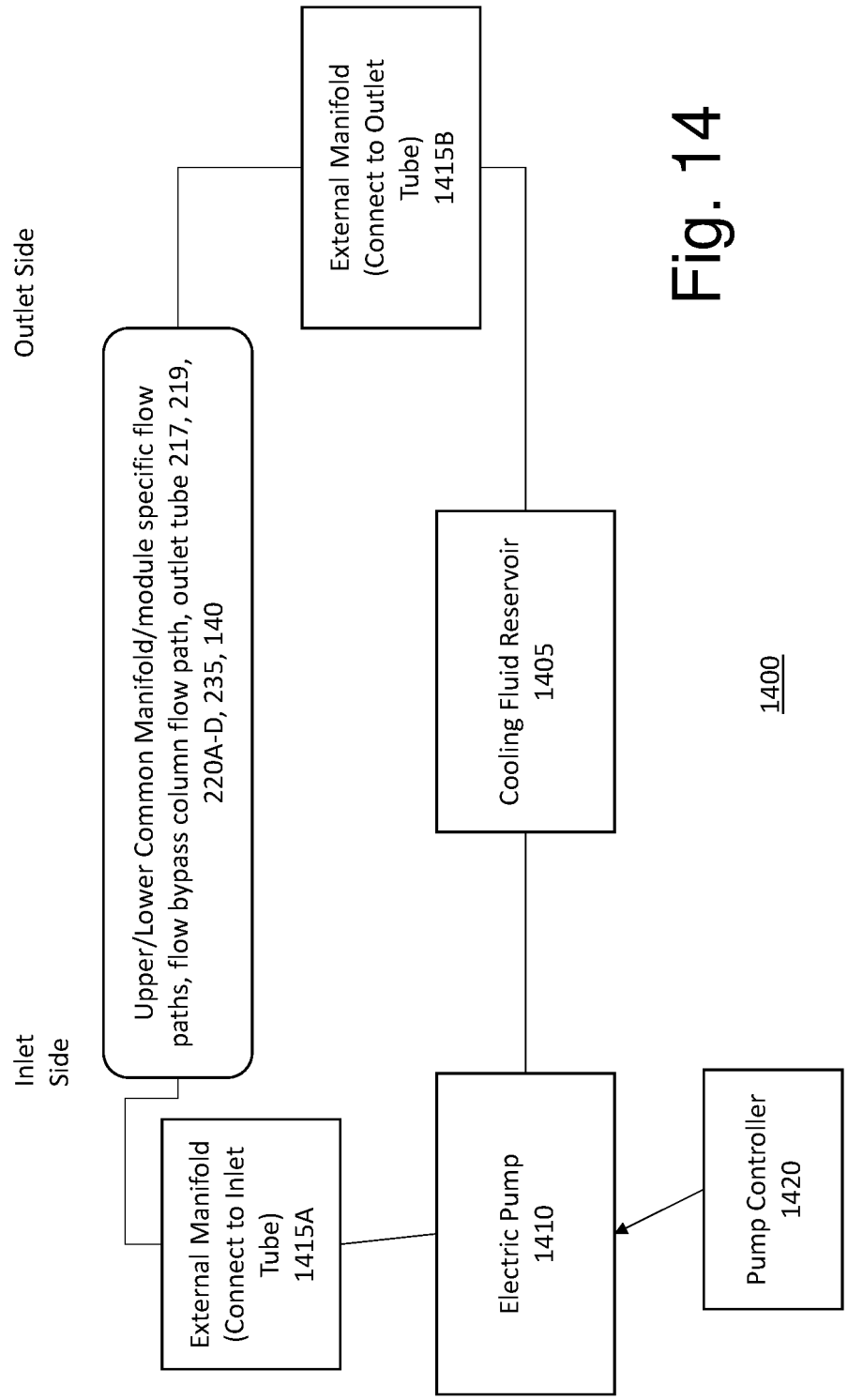
FIG. 14 illustrates a block diagram of a cooling system for the modular power control system which includes cooling the contactors in accordance with aspects of the disclosure.

The cooling system for the contactors 100 may be incorporated into the cooling system for the MPCS. The cooling system of the MPCS (block diagram of which is illustrated in FIG. 14) in accordance with aspects of the disclosure has multiple common manifolds 217, 219 internal to the MPCS. The common manifolds 217, 219 are internal to module chassis. The term "common" refers to the manifold running through each of the modules. The multiple common manifolds include an upper common manifold 219 and a lower common manifold 217. Upper and lower referring to the relative position of the manifolds in operation. Both the upper common manifold 219 and the lower common manifold 217 are formed from segments or sections (manifold segments). Each module chassis has a manifold segment for the upper common manifold 219 and a manifold segment (the fluid manifolds 55 are examples of the manifold segments) for the lower common manifold 217. An example of aligned segments for a particular configuration of the MPCS are shown in FIG. 13 (forming the upper common manifold 219 and the lower common manifold 217). The common manifolds 217, 219 provide fluid paths between the ends of the MPCS (endcaps) (inlet side and outlet side).

In the example depicted in FIG. 13, there are a control module, three single-phase out inverter modules, a DC interface module, two junction modules and the DC filter module as described herein. Each manifold segment (such as fluid manifolds 55) has a common manifold opening (which leads to a module specific flow path). The DC filter module flow path 220D is an example of a module specific flow path. Common manifold opening may provide an inlet or an outlet for the module specific flow paths depending on the direction of flow within the module specific flow path. The control module, the inverter modules and the DC interface module may have module specific flow paths. The control module flow path 220A, the inverter module flow path 220B and the DC interface module flow path 220C may be different.

The MPCS has another endcap on the inlet side. An inlet tube 202 may be mounted on one side of the endcap (external side). The inlet tube 202 may extend substantially parallel the endcap. In some aspects of the disclosure, the diameter of the inlet tube 202 may be about 3 times the size as the diameter of the module specific flow paths (collectively "220"). An open end of the inlet tube 202 may have inlet 25. The inlet 25 may be connected to tubes, pipes (such as the external manifold 1415A) for input of fluid for the cooling system of the MPCS. The inlet tube 202 may extend from a front of the endcap to a back of the endcap. The inlet tube 202 may curve to enter the endcap. The endcap may have an opening (common manifold inlet 215) to connect the inlet tube 202 to the common manifold such as the lower common manifold 217.

The common manifold inlet 110 has a diameter D. The diameter D also controls the flow rate/volume of the fluid. In some aspects of the disclosure, the diameter D may be about 24 mm. The diameter D may be set based on a target pressure drop between the inlet 25 and outlet 26. For example, the target pressure drop may be less than 5 psi. The pressure drop is a function of the flow control opening, the diameter of the common manifold inlet 215 and the diameter of the chassis channel opening 51 (also referred to as common manifold opening). The diameter D may be application specific to a vehicle or type, number of modules and types of modules.

FIG. 14 illustrates a block diagram of a cooling system 1400 for the MPCS which includes contactor cooling described herein in accordance with aspects of the disclosure. The cooling system 1400 comprises the internal manifolds/flow paths described above such as the upper common manifold 219, the lower common manifold 217 and module specific flow paths 220A-D (and the flow bypass column flow path 235 and outlet tube 140). The cooling system 1400 also comprises external manifolds 1415A, 1415B. One external manifold 1415A is connected to the inlet tube 202 (via inlet 25). The other external manifold 1415B is connected to the outlet tube 140 (via outlet 26). The cooling system 1400 also comprises a cooling fluid reservoir 1405. The cooling fluid reservoir 1405 stores the cooling fluid for the system 1400. The cooling system 1400 also comprises an electric pump 1410 and pump controller 1420. The electric pump 1410, under the control of the pump controller 1420, pumps the fluid stored in the cooling fluid reservoir 1405 into the external manifold 1415A for transfer to the internal manifolds/flow paths 217, 219, 220A-220D, (and the flow bypass column flow path 235 and outlet tube 140) (via the inlet 25). Once the fluid is pump through the internal manifolds/flow paths 217, 219, 220A-220D, (and the flow bypass column flow path 235 and outlet tube 140) (via the inlet 25), the fluid returns to the cooling fluid reservoir 1405 via the external manifold 1415B.

Each external manifold 1415A, 1415B may be a hose or a tube. The external manifold 1415B may comprise one or more heat exchangers to remove the heat from the fluid. In other aspects, the heat exchangers may be external to the external manifold 1415B. The heat exchanger may have an air-cooling system.

FIG. 14 illustrates one pump 1410 and controller 1420; however, multiple pumps 1410 and/or controllers 1420 may be used to circulate the fluid within the system 1400. For example, one pump 1410 may be on the inlet side and another on the outlet side. In an aspect of the disclosure, one controller 1420 may control both electric pumps 1410. However, for redundancy, multiple controllers 1420 may be used. In an aspect of the disclosure, the reservoir 1405 may have a fluid sensor disposed at a certain volume to measure the amount of fluid within the system 1400. The sensor may issue an alert when the fluid is below the sensor level to indicate that the fluid needs to be replaced (re-filled).

In an aspect of the disclosure, the fluid may be any suitable combination of water and another liquid. Another liquid may be a commercially available refrigerant. In some aspects of the disclosure, the fluid may be a water-ethylene-glycol mixture or solution. For example, there may be a 50/50% concentration between the water and the ethylene-glycol. Different fluids may be used for different configurations of the MPCS. In other aspects of the disclosure, a mixture or solution of water-propylene glycol may be used.

In an aspect of the disclosure, the controller 1420 may control the electric pump 1410 to provide a preset total flow rate into the internal manifolds/flow paths 217, 219, 220A-220D, (and the flow bypass column flow path 235 and outlet tube 140) (via the inlet 25). The total flow rate may be about 40 Liters-per-minute (LPM) to about 54 LPM.

The direction and flow of the fluid within the MPCS may controlled using a blocking plate or the orifice plate 160. The blocking plate blocks fluid from flowing downstream of the blocking plate in the common manifold (which the blocking plate is installed). By using the orifice plate 160 as described above, a majority of the flow may be diverted into the bypass column 135 (e.g., about 36 LPM). The DC filter module flow path 220D may have about 2.0 LPM. Since the contactor terminal-side cooling of the contactor terminals 102, 104 is more efficient than the mount-side cooling, by having more flow in the bypass column 135, the terminal-side cooling is enhanced.

In some aspects of the disclosure, the position of the blocking plate within the MPCS may cause the fluid to enter the DC filter module from the upper common manifold 219.

A similar cooling system described in FIG. 14 may be used for a contactor cooling system for an individual power unit. The inlet tube 202 may be upstream of the base 52 of the power unit and the fluid controlled in a similar manner.

The contactors 100 described herein may be rated for a current at a particular temperature. For example, the contactors 100 may be LEV 200 Series Contactors from Tyco Electronics. These contactors have a carry rating of about 500 A at 65°. However, by using the contactor terminal-side cooling and the mount-side cooling as described herein, the contactors 100 may operate at or above the rating during operation even though components are generating heat. For example, the contactor 100 may be used in a 600 A DC link.

The endcap 250 also has a slot (not labeled in FIGS. 7 and 8) for the distribution bus 130 to electrically connect the DC filter module to the other modules. In some aspects of the disclosure bus 130 may be bus extensions to connect to a DC backplane.

The endcaps may also comprise a bleed valve port. The bleed valve port may have a controllable opening such that trapped air within the fluid may be expunged from the fluid via the bleed valve port.

In the discussion and claims herein, the term "about" indicates that the value listed may be somewhat altered, as long as the alteration does not result in nonconformance of the process or device. For example, for some elements the term "about" can refer to a variation of ±0.1%, for other elements, the term "about" can refer to a variation of ±1% or ±10%, or any point therein. For example, the term about when used for a measurement in mm, may include+/0.1, 0.2, 0.3, etc., where the difference between the stated number may be larger when the state number is larger. For example, about 1.5 may include 1.2-1.8, where about 20, may include 18.0-22.0.

As used herein, the term "substantially", or "substantial", is equally applicable when used in a negative connotation to refer to the complete or near complete lack of an action, characteristic, property, state, structure, item, or result. For example, a surface that is "substantially" flat would either completely flat, or so nearly flat that the effect would be the same as if it were completely flat. "Substantially" when referring to a shape or size may account for manufacturing where a perfect shapes, such as circular or sizes may be difficult to manufacture.

As used herein terms such as "a", "an" and "the" are not intended to refer to only a singular entity, but include the general class of which a specific example may be used for illustration. As used herein, terms defined in the singular are intended to include those terms defined in the plural and vice versa.

References in the specification to "one aspect", "certain aspects", "some aspects" or "an aspect", indicate that the aspect(s) described may include a particular feature or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

For purposes of the description hereinafter, the terms "upper", "lower", "right", "left". "vertical", "horizontal", "top", "bottom", and derivatives thereof shall relate to a device relative to a floor and/or as it is oriented in the figures or with respect to a surface.

Reference herein to any numerical range expressly includes each numerical value (including fractional numbers and whole numbers) encompassed by that range. To illustrate, reference herein to a range of "at least 50" or "at least about 50" includes whole numbers of 50, 51, 52, 53, 54, 55, 56, 57, 58, 59, 60, etc., and fractional numbers 50.1, 50.2 50.3, 50.4, 50.5, 50.6, 50.7, 50.8, 50.9, etc. In a further illustration, reference herein to a range of "less than 50" or "less than about 50" includes whole numbers 49, 48, 47, 46, 45, 44, 43, 42, 41, 40, etc., and fractional numbers 49.9, 49.8, 49.7, 49.6, 49.5, 49.4, 49.3, 49.2, 49.1, 49.0, etc.

The terminology used herein is for the purpose of describing particular embodiments only and is not intended to be limiting the scope of the disclosure and is not intended to be exhaustive. Many modifications and variations will be apparent to those of ordinary skill in the art without departing from the scope and spirit of the disclosure.

What is claimed is:

1. A cooling system for contactors, each contactor has a first end mounted to a base of a chassis and a second end having a first contactor terminal and a second contactor terminal, two contactors form a contactor pair for a DC interface, the first contactor terminal of a first contactor of the contactor pair being connected to a first busbar and the second contactor terminal of the first contactor of the contactor pair being connected to a second busbar, the first contactor terminal of a second contactor of the contactor pair being connected to a third busbar and the second contactor terminal of the second contactor of the contactor pair being connected to a fourth busbar, the cooling system comprising:
   a cover configured to be mounted to sidewalls of the chassis, when mounted, the cover has an interior side facing the base of the chassis and an exterior side opposite the interior side, the cover comprising:
      a first flow channel extending in a first direction between a first end and a second end of the cover, the first flow channel connectable to a fluid source; and
      a plurality of thermally conductive bosses projecting from the interior side of the cover, each of the plurality of thermally conductive bosses being configured to contact at least one of a respective one of a first busbar, a second busbar, a third busbar, and a fourth busbar via an electrically insulating member, wherein at least one of the plurality of thermally conductive bosses is offset in a second direction from the first flow channel, the second direction being perpendicular to the first direction, wherein the cover is thermally conductive.

2. The cooling system of claim 1, wherein the first busbar and the third busbar share one of the plurality of thermally conductive bosses.

3. The cooling system of claim 1, wherein each thermally conductive boss has a distal end, the electrically insulating member covering the distal end, wherein the distal end of the thermally conductive boss is parallel to a corresponding busbar which the thermally conductive bosses indirectly contacts.

4. The cooling system of claim 1, wherein the cover further comprises a second flow channel connected to the first flow channel, the second flow channel extending in the second direction, the second flow channel being offset in the first direction from certain thermally conductive bosses.

5. The cooling system of claim 4, further comprising a third flow channel connected to the first flow channel, the third flow channel connects the base of the chassis and the cover, the third flow channel extending in a third direction perpendicular to the first direction and the second direction, the third flow channel supplying fluid to the first flow channel.

6. The cooling system of claim 5, wherein the fluid source is upstream of the third flow channel.

7. The cooling system of claim 5, further comprising a fourth flow channel connected to the first flow channel and the second flow channel, the fourth flow channel connects the base of the chassis and the cover, the fourth flow channel extending in the third direction, the first flow channel extending between the third flow channel and the fourth flow channel.

8. The cooling system of claim 7, wherein the base further comprises at least one chassis flow channel connected between the third flow channel and the fourth flow channel, the at least one chassis flow channel, the third flow channel and the fourth flow channel being offset from the at least two thermally conductive bosses in the second direction, and wherein the base is thermally conductive.

9. The cooling system of claim 8, wherein the fluid source is upstream of the third flow channel and wherein the fluid divides to flow into the third flow channel and the at least one chassis flow channel and after flowing through the at least one chassis flow channel the fluid flows into the fourth flow channel.

10. The cooling system of claim 9, wherein the fluid flowing in the third flow channel flows into the first flow channel, and the fluid in the first flow channel merges with fluid flowing in the fourth flow channel and enters the second flow channel.

11. The cooling system of claim 1, wherein the base, the cover and the at least two thermally conductive bosses are comprised of an aluminum alloy.

12. The cooling system of claim 1, wherein a plurality of contactors pairs is mounted to the chassis, each contactor pair being for a different DC interface, wherein the at least two thermally conductive bosses are configured to contact corresponding busbars which are respectively connected to the first contactor terminal and the second contactor terminal of the contactors via an electrically insulating member, respectively.

13. The cooling system of claim 12, wherein at least two of the DC interfaces are configured for a different current.

14. The cooling system of claim 9, wherein the contactors are installed in a module of a modular power control system (MPCS) and wherein the cover is an endcap for the MPCS.

15. The cooling system of claim 14, wherein the third flow channel and the fourth flow channel are manifold segments, respectively for two common manifolds for the MPCS providing fluid between a plurality of modules of the MPCS.

16. The cooling system of claim 15, wherein the first flow path is formed from a bypass flow path for the fluid to bypass flowing into certain modules of the MPCS and the second flow path is an outlet tube.

* * * * *